US00RE43265E

(19) United States
(12) Reissued Patent
Kirn

(10) Patent Number: US RE43,265 E
(45) Date of Reissued Patent: Mar. 27, 2012

(54) REDUCED OUTPUT TOPOLOGY FOR MULTI-REFERENCE SWITCHING AMPLIFIERS

(75) Inventor: Larry Kirn, Austin, TX (US)

(73) Assignee: JM Electronics Ltd. LLC, Wilmington, DE (US)

(21) Appl. No.: 12/245,579

(22) Filed: Oct. 3, 2008

Related U.S. Patent Documents

Reissue of:
(64) Patent No.: 7,116,162
Issued: Oct. 3, 2006
Appl. No.: 10/649,035
Filed: Aug. 27, 2003

U.S. Applications:
(60) Provisional application No. 60/406,207, filed on Aug. 27, 2002.

(51) Int. Cl.
*H03F 3/38* (2006.01)

(52) U.S. Cl. ..... 330/10; 330/207 A; 330/251

(58) Field of Classification Search ..... 330/10, 330/207 A, 251
See application file for complete search history.

(56) References Cited

U.S. PATENT DOCUMENTS

| | | | | |
|---|---|---|---|---|
| 5,438,694 | A | 8/1995 | Muri et al. | 455/341 |
| 6,492,868 | B2 | 12/2002 | Kirn | 330/10 |
| 6,509,793 | B2 | 1/2003 | Kirn | 330/10 |
| 6,535,058 | B1 | 3/2003 | Kirn | 330/10 |
| 7,116,162 | B2 | 10/2006 | Kirn | 330/10 |

FOREIGN PATENT DOCUMENTS

| | | |
|---|---|---|
| WO | WO 00/28658 | 5/2000 |

*Primary Examiner* — Khanh Nguyen
(74) *Attorney, Agent, or Firm* — Dorsey & Whitney LLP

(57) ABSTRACT

A method and attendant circuitry reduces the number of regulatory and switching devices in a multi-reference switching amplifier. In the preferred embodiment, multiple independently-modulated effective references are summed at a load through use of both linear and switched control of switching devices.

20 Claims, 1 Drawing Sheet

REDUCED OUTPUT TOPOLOGY FOR MULTI-REFERENCE SWITCHING AMPLIFIERS

Matter enclosed in heavy brackets [ ] appears in the original patent but forms no part of this reissue specification; matter printed in italics indicates the additions made by reissue.

REFERENCE TO RELATED APPLICATION

This application claims priority to U.S. Provisional Patent Application Ser. No. 60/406,207, filed Aug. 27, 2002, the entire content of which is incorporated herein by reference.

FIELD OF THE INVENTION

This invention relates generally to multi-reference switching amplifiers and, in particular, to a simplified output topology associated with such amplifiers.

BACKGROUND OF THE INVENTION

Multi-reference switching amplifiers of the type shown, for example, in PCT application PCT/US99/26691, entitled "Multi-Reference High Accuracy Switching Apparatus," yield significantly higher instantaneous resolution than standard switching amplifiers. The cost for this performance improvement, however, resides in an additional regulatory device and one or two switching devices (for non-bridged or bridged configurations, respectively) per reference added.

Particularly in cost-sensitive applications, there remains a need for a simplified output topology that retains the function and resolution inherent in multi-reference switching amplifiers.

SUMMARY OF THE INVENTION

The present invention resides in a method and attendant circuitry for reducing the number of regulatory and switching devices in a multi-reference switching amplifier. In the preferred embodiment, multiple independently-modulated effective references are summed at a load through use of both linear and switched control of switching devices.

DETAILED DESCRIPTION OF THE INVENTION

Figure 1:
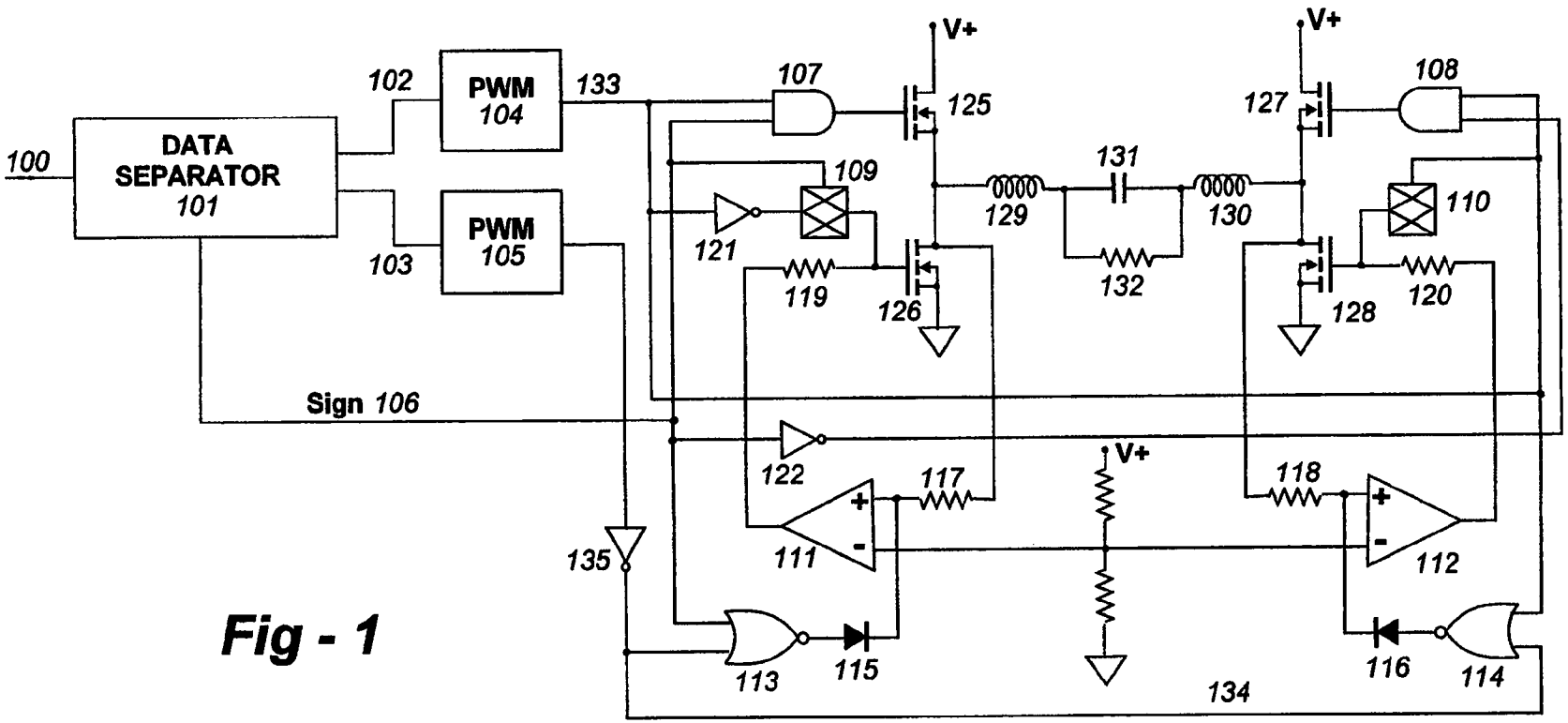
FIG. 1 shows a preferred embodiment of the present invention.

Referring now to FIG. 1, switching devices 125, 126, 127, and 128 form a bridged output known in the art as an "H" bridge. Inductors 129 and 130, in conjunction with capacitor 131, filter switching alias products from the load 132. Note that in this case only four output switching devices are used.

Data separator 101 isolates coarse data 102 and fine data 103 from incoming data stream 100. These data streams 102 and 103 are presented as inputs to pulsewidth modulators 104 and 105, which proportionally convert said coarse data 102 and fine data 103 into modulated coarse pulse stream 133 and fine pulse stream 134, respectively. If the sign 106 of the incoming data stream 100 is high, as indicated by data separator 101, switching device 125 is modulated by the coarse pulsewidth stream 133, through AND gate 107. While the sign 106 is high, transmission gate 109 is activated, forcing the control input of switching device 126 to follow the complement of coarse pulse width stream 133, as inverted by inverter 121. Resistor 119 serves to limit output current of differential amplifier 111.

Conversely, if the indicated sign 106 of the incoming data stream 110 is low; switching devices 127 and 128 are modulated by the coarse pulsewidth stream 133 (through AND gate 108) and its complement (through transmission gate 110 and inverter 121), respectively. Resistor 120 serves to limit output current of differential amplifier 112. Coarse modulation in this fashion operates exactly as shown in the multi-reference application referenced above.

A second reference voltage, proportional to the power supply voltage V+, is formed by the resistor divider 123/124, and input to differential amplifiers 111 and 112. When not disturbed by transmission gate 109, switching device 125, or diode 115, differential amplifier 111 outputs a voltage to cause the output of switching device 126 to equal the reference voltage formed by resistors 123 and 124. When the indicated sign 106 is low, NOR gate 113 turns on diode 115 with the inverse (from inverter 135) of the fine pulsewidth stream from pulsewidth modulator 105, forcing switching device 126 to turn on, through the resultant output increase of differential amplifier 111. This results in switching at the output of switching device 126 between ground and the reference voltage formed by resistors 123 and 124, inversely modulated by fine-resolution 103 provided to pulse width modulator 105.

When not disturbed by transmission gate 110, switching device 127, or diode 116, differential amplifier 112 outputs a voltage to cause the output of switching device 128 to equal the reference voltage formed by resistors 123 and 124. When the indicated sign 106 is high, NOR gate 114 turns on diode 116 with the inverse (from inverter 135) of the fine pulse width stream from pulse width modulator 105, forcing switching device 128 to turn on, through the resultant output increase of differential amplifier 112. This results in switching at the output of switching device 128 between ground and the reference voltage formed by resistors 123 and 124, inversely modulated by fine-resolution 103 provided to pulse width modulator 105.

In the discussion above, coarse-resolution data 102 is used to modulate V+ on one side of load 132, while fine-resolution data 103 is used to modulate the reference voltage formed by resistors 123 and 124 on the other side of load 132, under control of data sign 106. Although summation at the load of multiple references, modulated by appropriate resolutions, directly follows the technique disclosed in the multi-reference application referenced above, note that this is accomplished by the present invention with significantly fewer output switching devices.

I claim:

1. In a multi-reference switching amplifier wherein switching devices control power supplied to a load in response to an input data stream having a sign, a simplified output topology, comprising:

first and second independently modulated references, wherein the second one of the references is derived through a voltage divider;

a data separator operative to separate the input data stream into [course] *coarse*-resolution data and fine-resolution data;

circuitry for modulating the first one of the references on one side of the load as a function of the coarse-resolution data; and circuitry for modulating second one of the references on the other side of the load as a function of the fine-resolution data.

2. The simplified output topology of claim 1, wherein the first one of the references is *a* supply rail.

*3. In a multi-reference switching amplifier, wherein switching devices control power supplied to a load, a circuit comprising:*

*first and second independently modulated references, wherein the second independently modulated reference is derived through a voltage divider;*

*a data separator operative to separate an input data stream into coarse-resolution data and fine-resolution data;*

*a first circuit configured to modulate the first independently modulated reference on a first side of the load as a function of the coarse-resolution data; and*

*a second circuit configured to modulate the second independently modulated reference on a second side of the load as a function of the fine-resolution data.*

*4. The circuit of claim 3, wherein the first independently modulated reference comprises a supply rail.*

*5. The circuit of claim 3, wherein the first circuit and the second circuit each comprise a pulsewidth modulation circuit.*

*6. The circuit of claim 3, wherein the first circuit is configured to modulate the first independently modulated reference on the first side of the load as a function of the coarse-resolution data in response to the input data stream having a first sign, and wherein the first circuit is further configured to modulate the second independently modulated reference on the first side of the load as a function of the fine-resolution data in response to the input data stream having a second sign.*

*7. The circuit of claim 6, wherein the second circuit is configured to modulate the second independently modulated reference on the second side of the load as a function of the fine-resolution data in response to the input data stream having the first sign, and wherein the second circuit is further configured to modulate the first independently modulated reference on the second side of the load as a function of the coarse-resolution data in response to the input data stream having the second sign.*

*8. The circuit of claim 7, wherein the first circuit comprises a first plurality of switching devices and the second circuit comprises a second plurality of switching devices.*

*9. The circuit of claim 8, wherein the data separator is further configured to couple a sign of the input data stream to the first and second circuits.*

*10. The circuit of claim 9, wherein the first and second circuits each comprise a transmission gate configured to receive the sign of the input data stream, wherein each respective transmission gate is coupled to one of the respective switching devices, and wherein each respective transmission gate is configured to provide the coarse-resolution data to the respective switching device in response to the sign of the input data stream.*

*11. A method for controlling a multi-reference switching amplifier configured to supply power to a load, the method comprising:*

*separating an input data stream into coarse-resolution data and fine-resolution data;*

*dividing a first reference voltage to obtain a second reference voltage;*

*modulating the first reference voltage on a first side of the load as a function of the coarse-resolution data; and*

*modulating the second reference voltage on a second side of the load as a function of the fine-resolution data.*

*12. The method of claim 11, wherein both said acts of occur in response to the input data stream having a first sign, and wherein the method further comprises:*

*modulating the second reference voltage on the first side of the load as a function of the fine-resolution data; and*

*modulating the first reference voltage on the second side of the load as a function of the coarse-resolution data.*

*13. The method of claim 11, further comprising converting the coarse-resolution data and the fine-resolution data into respective pulsewidth modulated pulse streams.*

*14. The method of claim 11, wherein said modulating the first reference voltage comprises switching the first side of the load between the first reference voltage and ground, and wherein said modulating the second reference voltage comprises switching the second side of the load between the second reference voltage and ground.*

*15. The method of claim 11, wherein said modulating the first reference voltage comprises using the coarse-resolution data to control a switching device coupled to the first side of the load.*

*16. The method of claim 11, wherein said modulating the second reference voltage comprises using the fine-resolution data to control a switching device coupled to the second side of the load.*

*17. A multi-reference switching amplifier configured to supply power to a load, the amplifier comprising:*

*a first plurality of switching devices configured to couple to a first side of the load;*

*a second plurality of switching devices configured to couple to a second side of the load;*

*first and second independently modulated references, wherein the second independently modulated reference is derived through a voltage divider;*

*a data separator operative to separate an input data stream into coarse-resolution data and fine-resolution data;*

*a first circuit coupled to the first plurality of switching devices and configured to modulate the first independently modulated reference as a function of the coarse-resolution data; and*

*a second circuit coupled to the second plurality of switching devices and configured to modulate the second independently modulated reference as a function of the fine-resolution data.*

*18. The amplifier of claim 17, wherein, in response to the data input stream having a first sign, the first circuit is configured to modulate the first independently modulated reference as a function of the coarse-resolution data and the second circuit is configured to modulate the second reference as a function of the fine-resolution data, and wherein, in response to the input data stream having a second sign, the first circuit is further configured to modulate the second reference as a function of the fine-resolution data and the second circuit is further configured to modulate the first reference as a function of the coarse-resolution data.*

*19. The amplifier of claim 18, wherein the data separator is further configured to couple the sign of the input data stream to the first and second circuits.*

*20. The amplifier of claim 18, wherein the first and second circuits each comprise a transmission gate configured to receive the sign of the input data stream, wherein each respective transmission gate is coupled to one of the respective switching devices, and wherein each respective transmission gate is configured to provide the coarse-resolution data to the respective switching device in response to the sign of the input data stream.*

* * * * *